United States Patent
Fukuda et al.

(10) Patent No.: US 9,065,251 B2
(45) Date of Patent: Jun. 23, 2015

(54) WAVELENGTH MONITOR, WAVELENGTH LOCKABLE LASER DIODE AND METHOD FOR LOCKING EMISSION WAVELENGTH OF LASER DIODE

(71) Applicant: SUMITOMO ELECTRIC INDUSTRIES, LTD., Osaka-shi, Osaka (JP)

(72) Inventors: Chie Fukuda, Yokohama (JP); Toshimitsu Kaneko, Yokohama (JP); Lance Thompson, San Jose, CA (US); Phillip Edwards, San Jose, CA (US)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 137 days.

(21) Appl. No.: 13/708,302

(22) Filed: Dec. 7, 2012

(65) Prior Publication Data
US 2013/0148676 A1     Jun. 13, 2013

Related U.S. Application Data

(62) Division of application No. 13/272,547, filed on Oct. 13, 2011, now abandoned.

(51) Int. Cl.
| | |
|---|---|
| *H01S 3/10* | (2006.01) |
| *H01S 3/13* | (2006.01) |
| *H01S 5/022* | (2006.01) |
| *H01S 5/0625* | (2006.01) |
| *H01S 5/0687* | (2006.01) |
| *H01S 5/042* | (2006.01) |
| *H01S 5/12* | (2006.01) |

(52) U.S. Cl.
CPC ............... *H01S 3/13* (2013.01); *H01S 5/02248* (2013.01); *H01S 5/0425* (2013.01); *H01S 5/06256* (2013.01); *H01S 5/0687* (2013.01); *H01S 5/1209* (2013.01); *H01S 5/1212* (2013.01)

(58) Field of Classification Search
CPC .............................. H01S 5/0687; H01S 5/0262
USPC ....................................................... 372/20, 32
See application file for complete search history.

(56) References Cited

U.S. PATENT DOCUMENTS

| | | | |
|---|---|---|---|
| 6,587,485 B1 * | 7/2003 | Renlund et al. ............... | 372/20 |
| 2005/0123018 A1 | 6/2005 | Takagi et al. | |

(Continued)

FOREIGN PATENT DOCUMENTS

| | | |
|---|---|---|
| JP | 2006-245346 | 9/2006 |
| JP | 2008-066318 | 3/2008 |

OTHER PUBLICATIONS

Kimoto et al., "Highly Reliable 40-mW 25-GHz×20-ch Thermally Tunable DFB Laser Module, Integrated with Wavelength Monitor", Furukawa Review, No. 24, 2003, pp. 1-4 w/ English language translation (5 pages).

*Primary Examiner* — Tod T Van Roy
(74) *Attorney, Agent, or Firm* — Smith, Gambrell & Russell LLP.

(57) ABSTRACT

A wavelength monitor monolithically integrated with a tunable LD is disclosed. The wavelength monitor includes at least two filters, each filter having a different periodic transmission spectrum. A transmittance of the first filter, and another transmittance of the second filter at a grid wavelength attributed to a WDM system forms a combination which is specific to the grid wavelength but different from other combinations at other grid wavelengths.

4 Claims, 14 Drawing Sheets

(56) References Cited

U.S. PATENT DOCUMENTS

2006/0222039 A1 10/2006 Yamazaki
2009/0168817 A1* 7/2009 Ishikawa et al. ................ 372/20
2010/0085991 A1* 4/2010 Okayama ........................ 372/20
2010/0316074 A1* 12/2010 Fukuda ..................... 372/43.01
2011/0051772 A1 3/2011 Fukuda

* cited by examiner

WAVELENGTH MONITOR, WAVELENGTH LOCKABLE LASER DIODE AND METHOD FOR LOCKING EMISSION WAVELENGTH OF LASER DIODE

CROSS REFERENCE TO RELATED APPLICATION

This application is a division of Ser. No. 13/272,547 filed Oct. 13, 2011, which is being incorporated in its entirety herein by reference.

BACKGROUND OF THE INVENTION

1. Field of the Invention

The present invention relates to a wavelength monitor, a wavelength lockable laser diode (hereafter denoted as LD) implementing with the wavelength locker, and a method for locking the emission wavelength of a tunable LD.

2. Related Background Art

Kimoto et al. disclosed a semiconductor laser module including a tunable distributed feedback (hereafter denoted as DFB) LD and a wavelength locker in a single package (Furukawa Technical Report 112, July, 2003, pp. 1 to 4). The wavelength locker disclosed therein had two photodiodes (hereafter denoted as PD), one of which detected a portion of back facet light directly from the DFB-LD, while the other of which detected another portion of the back facet light through an etalon filter. The emission wavelength of the DFB-LD may be tuned through these two detections.

Recent wavelength division multiplexing (hereafter denoted as WDM) system has ruled a span between nearest two grid wavelengths as 50 GHz within the wavelength region of 192 to 197 THz, which corresponds to the 1550 nm band. In such a system, an optical signal source is required to control the emission wavelength further precisely and stably. The emission wavelength of an LD often fluctuates due to operating temperature and/or a long-term degradation of device performance. The wavelength locker for such an LD is inevitable in the WDM system.

Conventional wavelength lockers have been implemented with an optical component having a periodic transmission spectrum against wavelengths. An etalon filter is one of typical components shown in such periodic transmission spectrum. The period between the transmission maxima of the etalon filter matches with the span of the grid wavelengths of the WDM system.

However, the wavelength locker described above leaves a subject that the locking performance may be available only within a narrow wavelength range. That is, when the emission wavelength of the LD shifts more than one period of the transmission spectrum, the wavelength locker tunes the emission wavelength next to the target wavelength, which is a fatal subject when such a wavelength locker is going to be applied to the recent WDM system.

Moreover, recent optical apparatus further requests to make the housing or package thereof as compact as possible. When the wavelength locker is realized by discrete components of the DFB-LD, the etalon filter, and PDs; these devices are arranged independently and coupled with, for instance, a condenser lens to obtain a satisfactory coupling condition, which inevitably enlarges the size of the housing/package.

SUMMARY OF THE INVENTION

An aspect of the present invention relates to a wavelength monitor monolithically integrated with a tunable LD. The wavelength monitor and the tunable LD may form a wavelength lockable LD. The wavelength monitor according to the present invention includes a first optical filter and a second optical filter, each of which may transmit light generated by the tunable LD and have the transmission spectrum periodically varying in a wavelength range attributed to the WDM system. A feature of the wavelength monitor of the present invention is that two transmission spectra have a combination in respective transmittances which is specific to the grid wavelength of the WDM system but different from combinations of respective transmittance at other grid wavelengths.

Another aspect of the present invention relates to a wavelength lockable LD that includes a tunable LD, a wavelength monitor monolithically integrated with the tunable LD, and a controller. The tunable LD may emit light with an emission wavelength substantially coincident with a target grid wavelength of the WDM system. The wavelength monitor may include first and second optical filters, each having the transmission spectrum periodically varying in the wavelength range of the WDM system. A feature of the present wavelength lockable LD is that two transmission spectra have a combination of transmittances thereof which is specific to the target grid wavelength but different from combinations in the transmittances at other grid wavelengths. The controller may tune the emission wavelength of the tunable LD such that two optical filters show a combination in respective transmittances equal to the combination at the grid wavelength.

Still another aspect of the present invention relates to a method to tune the emission wavelength of the wavelength lockable LD to a target wavelength. The wavelength lockable LD monolithically integrates a tunable LD with a wavelength monitor. The wavelength monitor includes first and second optical filters each having a periodic transmission spectrum whose transmittances at the target wavelength constitutes a combination which is specific to the target wavelength but different from combinations of transmittances at other wavelengths. The method may include steps of: (a) guiding light generated by the tunable LD to the first and second optical filters; (b) detecting respective outputs of the first and second optical filters; (c) tuning the emission wavelength of the tunable LD based on the output of the first optical filter so as to set the output of the first optical filter equal to a first preset transmittance for the transmission spectrum of the first optical filter; and (d) verifying the emission wavelength by comparing the output of the second optical filter with a second preset transmittance for the transmission spectrum of the second optical filter. A feature of the present method is that the first preset transmittance and the second preset transmittance constitute the specific combination of the transmittances at the target grid wavelength.

BRIEF DESCRIPTION OF THE DRAWINGS

The invention may be more completely understood in consideration of the following detailed description of various embodiments of the invention in connection with the accompanying drawings, in which.

DETAILED DESCRIPTION OF PREFERRED EMBODIMENTS

Next, some preferred embodiments according to the present invention will be described in detail. In the description of the drawings, the same numerals or symbols will refer to the same elements if possible without overlapping explanations. Aspect ratio in respective drawings does not always reflect the practical dimensions, and sometimes modified by the explanation sake.

(First Embodiment)

Figure 1:
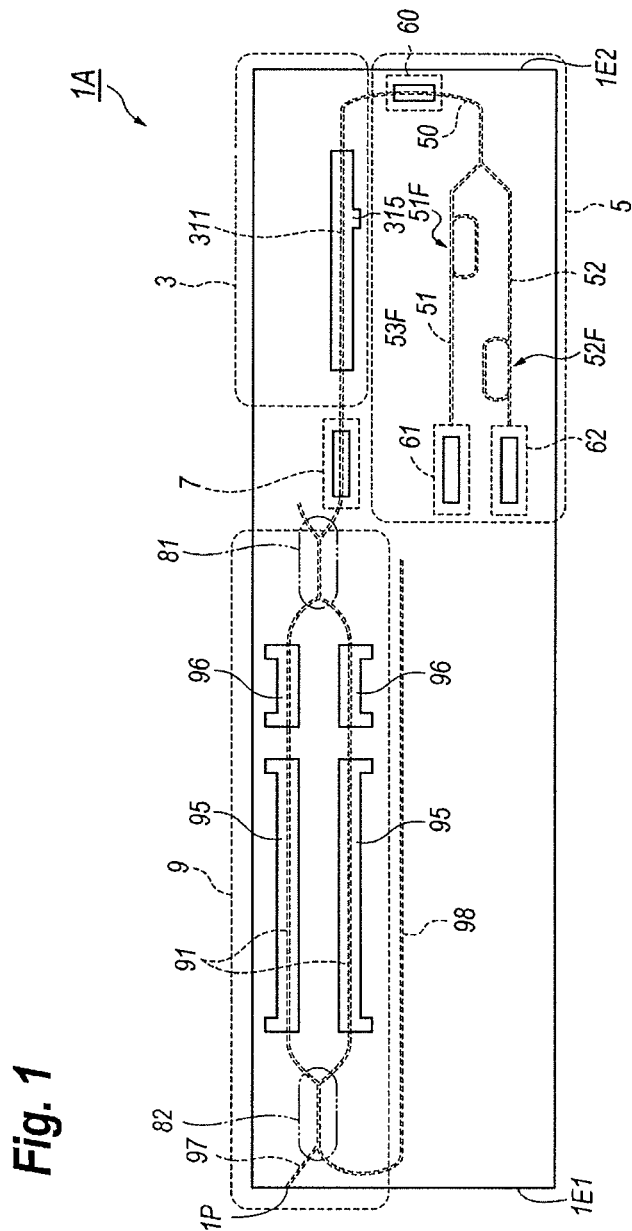
FIG. 1 is a plan view showing a wavelength lockable LD according to the first embodiment of the present invention.

A wavelength lockable LD according to the first embodiment of the present invention will be described first. FIG. 1 is a plan view showing the wavelength lockable LD 1A according to the first embodiment of the invention.

The wavelength lockable LD 1A includes a tunable LD 3, a wavelength monitor 5, a semiconductor optical amplifier (hereafter denoted as SOA) 7, and an optical modulator 9.

Figure 2:
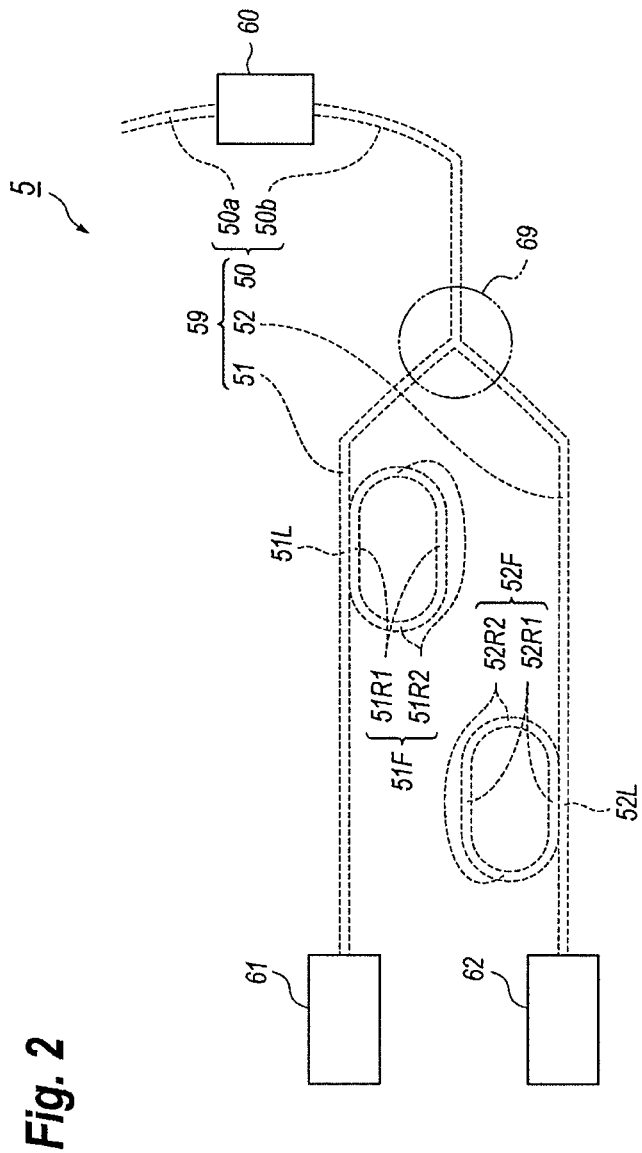
FIG. 2 magnifies the wavelength monitor shown in FIG. 1.

First, the wavelength monitor 5 will be described. FIG. 2 magnifies a primary portion of the wavelength monitor 5. The wavelength monitor 5 includes the base PD 60, the first PD 61, the second PD 62, and some waveguides 59 which includes three waveguides, 50-52. The base waveguide 50 has two waveguides, 50a and 50b, putting the base PD 60 therebetween. One of the base waveguides 50a, which is the front waveguide, optically couples with the active waveguide 311 in the tunable LD 3; while, the other waveguide 50b, the rear waveguide, optically couples with the optical coupler 69. The optical coupler 69 is a type of the multi-mode interference (MMI) coupler that divides an optical beam incoming from the rear waveguide 50b into two beams each propagating in the first and second waveguides, 51 and 52.

The first waveguide 51 includes a linear waveguide 51L extending horizontally in FIG. 2 and a ring filter 51F that comprises a pair of liner waveguides 51R1 and a pair of semicircular waveguides 51R2, where these waveguides, 51R1 and 51R2, form an oval and one of the liner waveguides 51R1 couples with the liner waveguide 51L. The first waveguide 51 has a periodic transmission spectrum, details of which depend on the optical path length of the first ring filter 51F. That is, adjusting the refractive index of the ring filter 51F and the dimensions thereof, the period of the periodic transmission spectrum of the first waveguide 51 may be controlled.

The second waveguide 52 also includes another ring filter 52F comprising a pair of linear waveguides 52R1 and a pair of semicircular waveguides 52R2, where those waveguides form another oval. One of the linear waveguides 52R1 couples with the linear waveguide 52L that propagates one of optical beams divided by the MMI coupler 69. The period of the periodic transmission spectrum of the second waveguide 52 may be adjusted by setting the optical path length of the second ring filter 52F. In the present embodiment shown in FIG. 2, the optical path length of the second ring filter 52F is slightly different from that of the first ring filter 51F. Details of the optical path lengths and differences of the periodic transmittance of respective ring filters, 51F and 52F, will be described later.

The first PD 61 receives light transmitting through the first waveguide 51, while, the second PD 62 receives light transmitting through the second waveguide 52.

The waveguides 59 in the wavelength monitor 5 propagate a portion of the light generated in the tunable LD 3 to respective PDs, 60 to 62, to be detected thereby. Specifically, the front waveguide 50a first transmits a portion of the light generated in the tunable LD 3 to the base PD 60. The PD may detect a portion of thus transmitted light and pass the rest (portion) of the light. The rear waveguide 50b may carry this rest portion of the light to the MMI coupler 69. The MMI coupler 69 may divide this rest portion of the light into two parts, one of which propagates on the first waveguide 51, modulated by the first ring filter 51F, and detected by the first PD 61; while, the other part propagates on the second waveguide 52, modulated by the second ring filter 52F, and detected by the second PD 62.

Next, details of the optical modulator 9 will be described. The optical modulator 9 according to the present invention includes a pair of waveguides 91 extending in parallel to each other between two MMI couplers, 81 and 82, with the arrangement of 2×2. That is, two modulation waveguides 91 are divided by the MMI coupler 81 which optically couples with the active waveguide 311 through the SOA 7, while, combined by the other MMI coupler 82 which optically couples with the output port 1P of the wavelength lockable LD 1A. The later MMI coupler 82 also couples with a surplus waveguide 98, where it is terminated in a side of the tunable LD 3. The light, generated in the tunable LD 3 and amplified by the SOA 7, is divided into two parts by the first MMI coupler 81. The divided beams each propagates in respective modulation waveguides 91 and merges in the second MMI coupler 82 to output from the port 1P. During the propagation in respective modulation waveguides 91, each beam senses the electric field different from the other, which may cause a phase difference between them; the light combined by the second MMI coupler 82 may be modulated. Specifically, applying an electrical modulation signal between two electrodes 95 in the modulation waveguides 91, the light propagating in one of the modulation waveguides 91 advances or delays the phase thereof by $\pi$ with respect to the light propagating in the other modulation waveguide 91; accordingly, the merged light substantially vanishes when the phase difference between two beams is $\pi$ but receives no effect when the phase of respective beams coincides to the other. Thus, the light emitted from the tunable LD 3 may be modulated by the modulation signal applied to the electrodes 95. The electrodes 96 which are also arranged in the modulation waveguides 91 may preset the phase difference between two beams.

Next, a method to control the wavelength lockable LD 1A, specifically, a method to tune the emission wavelength of the tunable LD 3, according to an embodiment of the present invention, will be described. The emission wavelength of the wavelength lockable LD 1A maybe tuned so as to coincide with one of grid wavelengths of the WDM system. In the explanation below, this one of grid wavelengths is called as the target wavelength.

Figure 3:
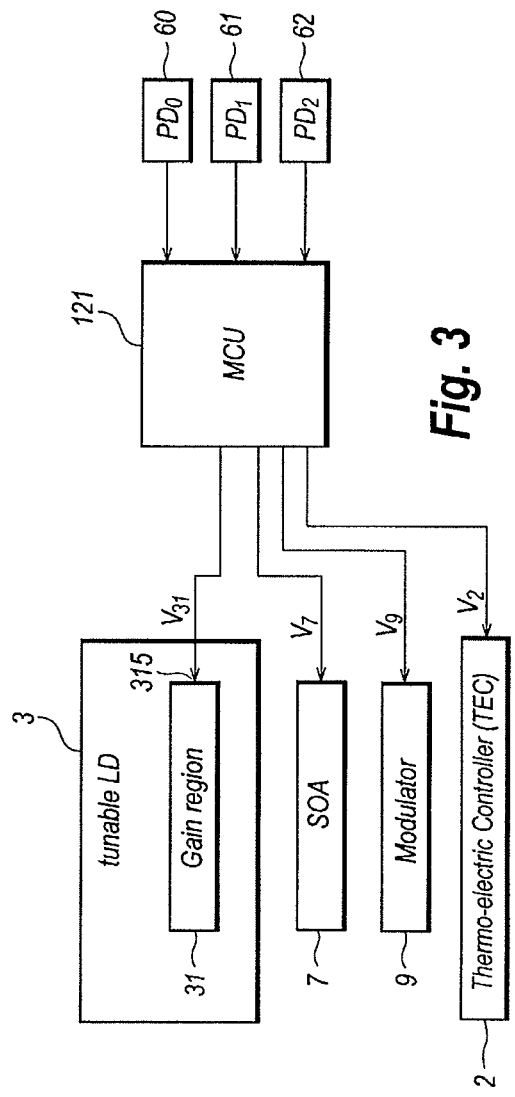
FIG. 3 shows a block diagram of a control circuit to tune the emission wavelength of the wavelength lockable LD shown in FIG. 1.

FIG. 3 is a block diagram of the control system for the wavelength lockable LD 1A, where the control system primarily includes a micro control unit (MCU) 121. The MCU 121, by receiving three outputs each coming from the base PD 60, and the first and second PDs, 61 and 62, may control the tunable LD 3, exactly, the gain region 31 thereof, the thermoelectric controller (hereafter denoted as TEC) 2, the SOA 7 and the modulator 9 so as to tune the emission wavelength of the tunable LD 3 coincident with the target wavelength. The MCU 121 may output control signals, $V_{31}$, $V_7$, $V_9$ and $V_2$, to respective elements.

Figure 4:
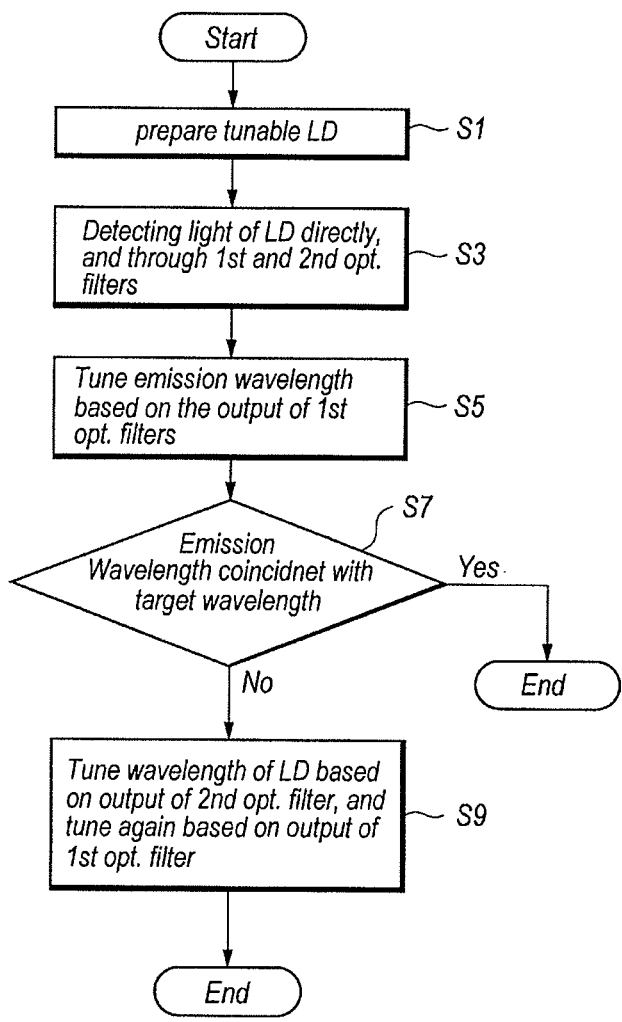
FIG. 4 shows a flow chart to tune the emission wavelength to a target wavelength.

Next, an algorithm to tune the emission wavelength of the wavelength lockable LD 1A according to the present embodiment will be described. FIG. 4 is a flowchart of the algorithm to tune the emission wavelength. The method according to the present embodiment includes steps of:

(S1) preparing a tunable LD 3 and measuring initial conditions for the tuning;
(S3) guiding light generated in the tunable LD 3 to respective PDs, 60 to 62, and detecting it by respective PDs in the wavelength monitor 5;
(S5) tuning the emission wavelength based on the outputs of the base and the first PDs, 60 and 61;
(S7) verifying the emission wavelength to be coincide with the target wavelength based on the base and second PDs, 60 and 62; and
(S9) when the emission wavelength is different from the target wavelength, tuning the emission wavelength based on the outputs of the base and the second PDs, 60 and 61, again.

(S1 Pre-Process)

The step S1 prepares a wavelength lockable LD 1A and initial operating conditions of the wavelength lockable LD 1A. Specifically, step S1 first sets the wavelength lockable LD 1A in a preset temperature by controlling the TEC 2; then monitors the emission wavelength of the LD 3 by an external wavelength detector under a condition where the gain region 31 of the tunable LD 3 is biased by the signal $V_{31}$ through the electrode 315 thereof. Next, shifting the temperature of the lockable LD 1A by controlling the TEC 2 such that the emission wavelength of the LD 3 coincides with one of grid wavelength of WDM communication system, which will be called as the target wavelength, parameters listed below are recorded when the emission wavelength just coincides with the target wavelength. Parameters to be recorded are the transmittance of the first ring filter 51F, that of the second ring filter 52F, the temperature of the TEC 2, the bias $V_{31}$ for the gain region 31, and the bias $V_7$ for the SOA 7. Two transmittances may be calculated from the outputs of three PDs, 60 to 61. The initial conditions described above are measured for respective grid wavelengths of the WDM system, and saved in, for instance, a look-up-table prepared in the MCU 121.

(S3 Guiding Light)

Step S3 selects one of grid wavelengths, which is the target wavelength, and sets parameters of the temperature of the TEC 2, the bias $V_{31}$ and the bias $V_7$ in respective devices to generate light by the tunable LD 3. In this process, the bias $V_7$ applied to the SOA 7 and the bias $V_9$ applied to the modulator 9 are preferably set such that the light emitted from the output port 1P substantially vanishes.

A portion of light generated by the tunable LD 3 enters respective PDs, 60 to 62, through the waveguides 59 and detected thereby. The first PD 61 may detect light filtered by the first ring filter 51F, while, the second PD 62 may detect light filtered by the second ring filter 52F.

(S5 First Tuning)

Step S5 tunes the emission wavelength based on the output of the first and second PDs, 61 and 62. The transmission spectra of the first and second ring filters, 51F and 52F, will be explained in advance to describe steps S5.

Figure 5A:
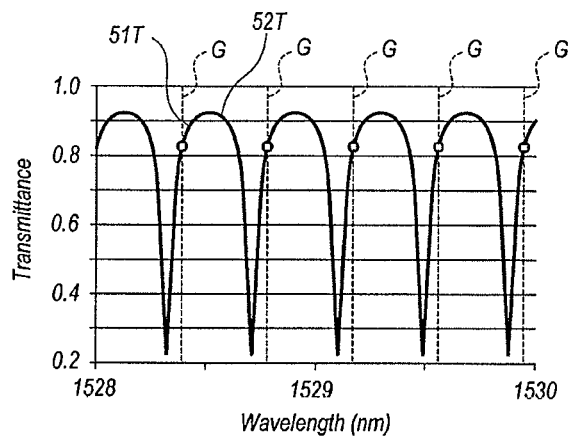
FIGS. 5A to 5C show transmission spectra of the ring filters implemented within the wavelength monitor shown in FIG. 2.
Figure 5B:
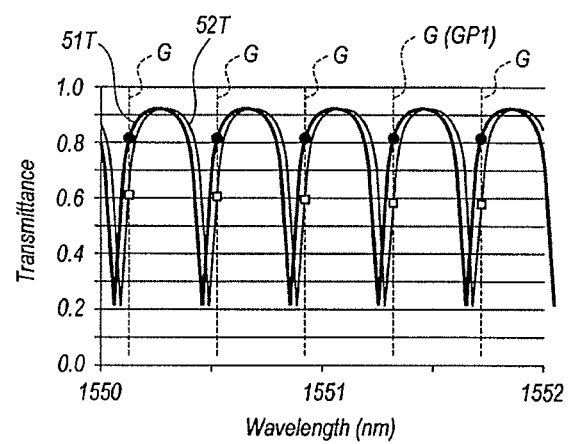
Figure 5C:
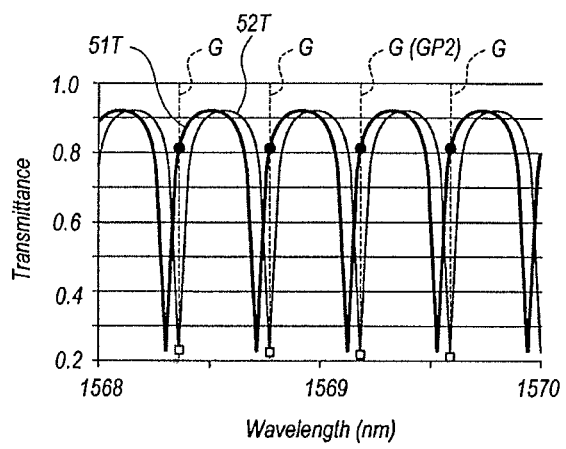

FIGS. 5A to 5C show the transmission spectra of two ring filters, 51F and 52F, where the horizontal axis shows the wavelength and the vertical axis corresponds to the transmittance. Bold lines in these figures are the transmission spectrum for the first ring filter 51F, while, thin lines are those of the second ring filter 52F. The grid wavelengths of the WDM system, which are denoted by the mark "G" in the figures, are arranged with a constant span of 50 GHz (about 0.4 nm)

As explicitly shown in the figures, especially, in FIGS. 5B and 5C, the period of the transmission spectrum of the first ring filter 51F is different from the period of the transmission spectrum of the second ring filter 52F. In the present embodiment, the latter period for the second ring filter 52F is slightly greater than that of the former period for the first ring filter 51F.

Moreover, the period of the transmission spectrum for the first ring filter 51F is substantially equal to the span of the grid wavelengths of the WDM system. Accordingly, the transmittance of the first ring filter 51F at the grid wavelengths, which is denoted by filled circles, becomes substantially constant to be about 0.817.

In a wavelength region where the tunable LD 3 may emit light, which is 1520 to 1570 nm in the present embodiment, the first ring filter 51F and the second ring filter 52F satisfy the following conditions: the transmission spectrum of the first ring filter 51F shows N cycles, where N is an integer equal to or greater than 2, and the transmission spectrum of the second ring filter 52F shows less than N cycles but equal to or greater than N−0.5 cycles, preferably, the second ring filter 52F shows less than N−0.1 cycles but equal to or greater than N−0.5 cycles. In the present embodiment, N is 125, that is, the transmission spectrum of the first ring filter 51F shows 125 cycles in the wavelength range of 1520-1570 nm, while, the second ring filter 52F shows about 124.5 cycles in the same wavelength range, which is just less than that of the first ring filter 51F.

Moreover, as shown in FIGS. 5A to 5C, the transmittance of the second ring filter 52F at the grid wavelengths G, which are illustrated by open squares, monotonically varies from the shortest grid wavelength to the longest grid wavelength, where the transmittance monotonically decreases in the present embodiment, which may give a combination of transmittances which is specific to the target wavelength but different from combinations in other grid wavelengths.

The transmission spectrum of the first ring filter 51F described above is available in an arrangement thereof where a length of the linear waveguide 51R1 is 496 μm, a diameter of the semi-circular waveguide 51R1 is 50 μm, and a material thereof has refractive index of 3.83005 at the wavelength of 1520 nm. While, the periodic transmission spectrum for the second ring filter 52F is available in an arrangement where a length of the linear waveguide 52R1 is 495 μm, a diameter of the semi-circular waveguide is 50 µm and a material thereof has the refractive index same with that of the first ring filter 51F.

The first tuning process S5 tunes the emission wavelength of the tunable LD 3 based on the output of the base PD 60 and that of the first PD 61. For instance, one case will be explained where the emission wavelength of the tunable LD 3 is put close to or substantially equal to one of grid wavelengths, which is marked by "GP1" in FIG. 5B. Referring to the lock-up table above described, the MCU 121 adjusts the temperature of the TEC 2 by sending the signal V2 to the TEC 2 such that the transmittance of the first ring filter 51F obtained by a ratio of the output of the first PD 61 against the output of the base PD 60 becomes equal to a value at the grid wavelength GP1, which is about 0.817 in FIG. 5B.

The process of the first tuning S5 is thus carried out. However, the transmittance of the first ring filter 51F shows the periodic characteristic whose period is substantially equal to the span of the grid wavelengths G as described above; accordingly, the MCU 121 may occasionally tune the emission wavelength to another grid wavelength GP2 shown in FIG. 5C when the emission wavelength fluctuates more than one period of the transmission spectrum of the first ring filter 51F, which is 0.4 nm in the present embodiment. In other words, the first ring filter 51F may provide a plurality of equivalent wavelengths, and the MCU 121 may operate to set the emission wavelength in one of the equivalent wavelengths, which is sometimes different from the target wavelength GP1.

(S7 Verification)

The verifying process S7 may be carried out after the first tuning S5. As described above, even if the first tuning S5 sets the emission wavelength in another grid wavelength different from the target wavelength, the verification process S7 may detect the fact that the emission wavelength is not the target wavelength by the outputs of the second PD 62 and the base PD 60.

Specifically, the transmittance of the second ring filter 52F at the grid wavelengths G are different from each other as shown in FIGS. 5A to 5C in the wavelength range. Accordingly, the transmittance of the second ring filter 52F obtained by the second PD 62 and that of the base PD 60 when the emission wavelength is set in another grid wavelength GP2 is shifted from the transmittance thereof when the emission wavelength is just set in the target wavelength GP1. For instance, the transmittance of the second ring filter 52F, when the emission wavelength is improperly set in the other wavelength GP2, becomes about 0.220, while, the transmittance thereof when the emission wavelength is properly set to the target wavelength GP1 is about 0.595.

Accordingly, the MCU 121 may verify, based on the transmittance of the second ring filter 52F, whether the emission wavelength is properly set to the target wavelength GP1 among the grid wavelengths G. When the MCU 121 decides that the emission wavelength is properly controlled to the target wavelength GP1, the process to control the emission wavelength of the tunable LD 3 is completed. However, the MCU 121 decides that the emission wavelength is improperly controlled; the MCU 121 may proceed to the second tuning S9.

(S9 Second Tuning)

The second tuning S9 controls the emission wavelength first by the output of the second PD 62 and that of the base PD 60; then by the output of the first PD 61 and that of the base PD 60. Specifically, the MCU 121 first controls the TEC 2 such that the transmittance of the second ring filter 52F obtained by the ratio of the output of the second PD 62 against that of the base PD 60 puts close to the value of the transmittance thereof at the target wavelength GP1, which is about 0.595 in the present embodiment. After the adjustment above, the emission wavelength is fallen within a wavelength range of one period of the transmission spectrum in which the target wavelength GP1 belongs.

Then, the MCU 121 precisely controls the TEC 2 such that the transmittance of the first ring filter 51F calculated by the output of the first PD 61 and that of the base PD 60 becomes the value at the target wavelength GP1, which is 0.817 in the present embodiment. Because the emission wavelength of the tunable LD 3 is set in the wavelength close to the target wavelength GP1 in advance to the precise tuning, the MCU 121 may properly tune the emission wavelength of the tunable LD 3 in the target wavelength GP1.

After the tuning of the emission wavelength, the MCU 121 may further adjust the emission magnitude of the tunable LD 3 so as to be equal to a preset magnitude by control the bias $V_7$ applied to the SOA 7. Furthermore, the MCU 121 may adjust the bias $V_9$ applied to the modulator 9 so as to get a properly modulated light from the modulator 9. Thus, the light having the target wavelength which is precisely adjusted, the preset magnitude, and the properly modulated may be obtained from the output port 1P.

(Second Embodiment)

Figure 6:
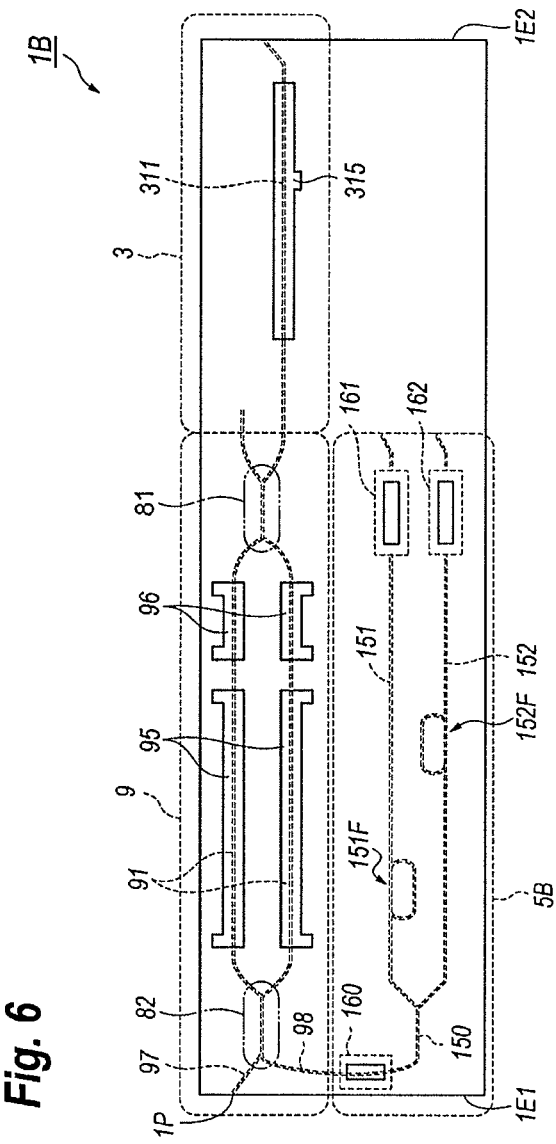
FIG. 6 is a plan view showing another wavelength lockable LD according to the second embodiment of the invention.

Next, the second embodiment of the wavelength lockable LD according to the present invention will be described in detail. FIG. 6 is a plan view of the wavelength lockable LD 1B according to the second embodiment of the invention. The wavelength lockable LD 1B has a different arrangement from those of the first wavelength lockable LD 1A in viewpoints of the SOA-less tunable LD 3 and a different wavelength monitor 5B.

The wavelength monitor 5B of the present embodiment exists in downstream of the modulator 9; that is, the wavelength monitor 5B couples in the first waveguide 51 thereof with the end of the active waveguide 311 of the tunable LD 3 through the surplus waveguide 98, the modulation waveguide 91, and the MMI coupler 81 of the modulator 9. The other end of the active waveguide 311 is terminated in the end facet of the wavelength lockable LD 1B.

The wavelength monitor 5B of the present embodiment also includes the base PD 160, the first PD 161, and the second PD 162. The light entering the waveguide 150 divided by the MMI coupler 82 is partially absorbed by the base PD 160 but a most part of the light passes the base PD 160 and divided into two beams, one of which enters the first ring filter 151F, while, the other of which enters the second ring filter 152F. Both light beams entering respective waveguides, 151 and 152, are terminated after passing the first PD 161 and the second PD 162.

The wavelength monitor 5B may tune the emission wavelength of the tunable LD 3 even the emission wavelength thereof remarkably shift from the target wavelength by the mechanism same as those of the wavelength monitor 5A according to the first embodiment.

(Third Embodiment)

Figure 7:
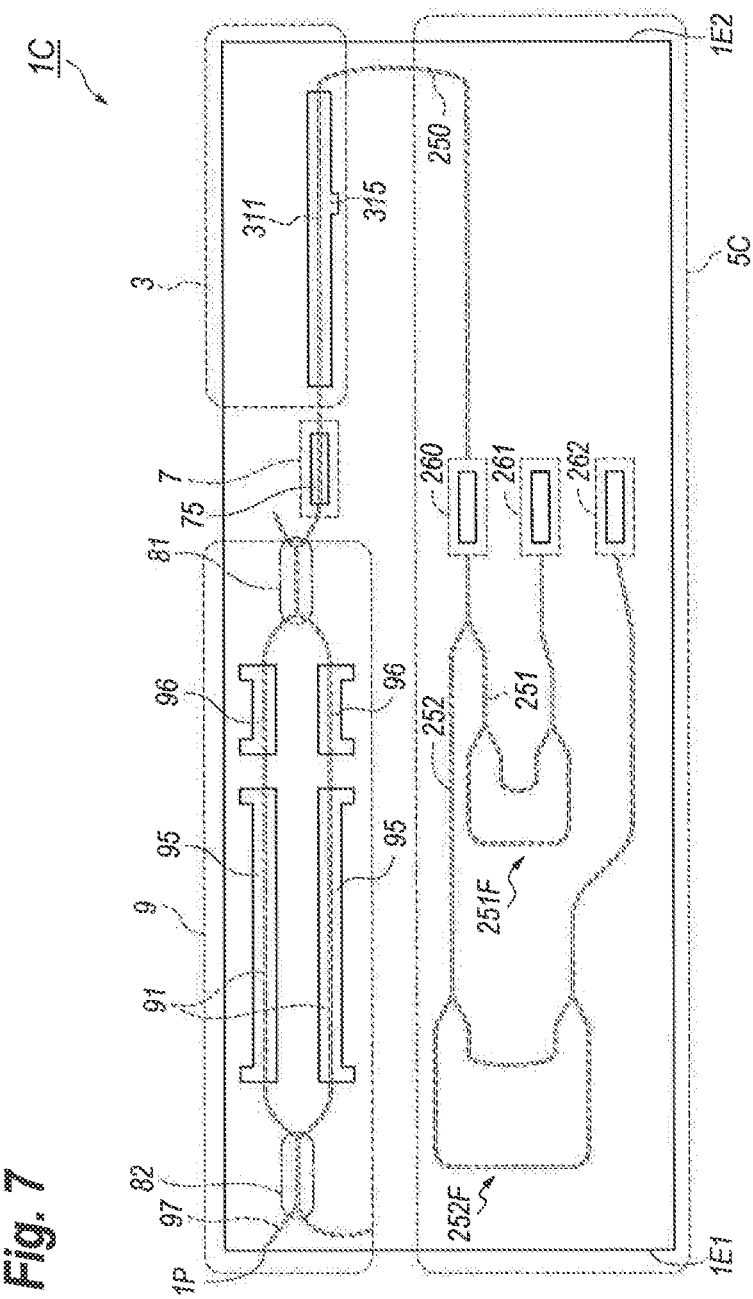
FIG. 7 is a plan view showing still another wavelength lockable LD according to the third embodiment of the invention, where the wavelength lockable LD of the present embodiment implements with Mach-Zender filters in the wavelength monitor.

FIG. 7 is a plan view of a wavelength lockable LD 1C according to the third embodiment of the present invention. The wavelength lockable LD 1C includes the tunable LD 3, the SOA 7, the modulator 9, and another type of wavelength monitor 5C.

Figure 8:
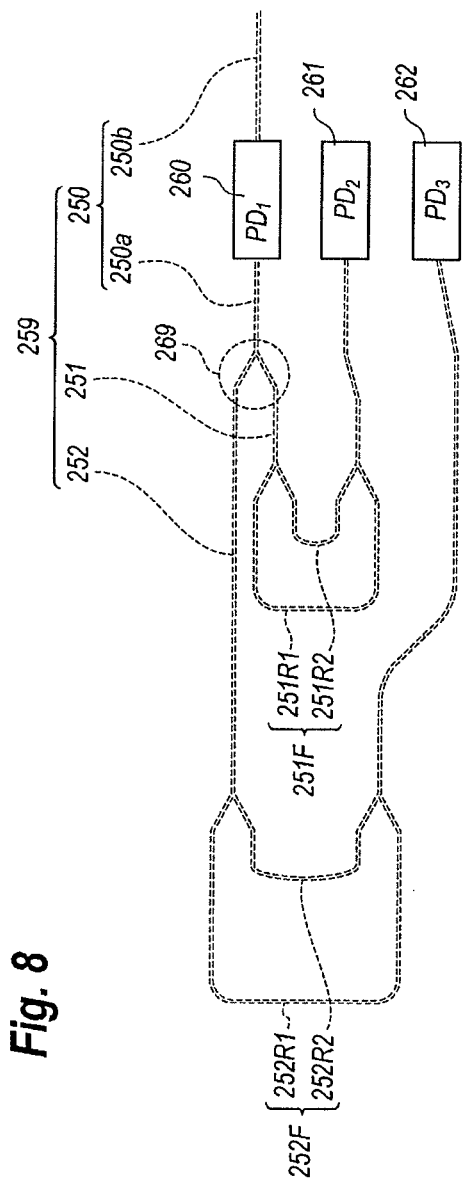
FIG. 8 magnifies the wavelength monitor implemented within the wavelength lockable LD shown in FIG. 7.

The wavelength monitor 5C according to the present embodiment will be described in detail. FIG. 8 is a plan view of the wavelength monitor 5C. The wavelength monitor 5C includes three PDs, namely, the base PD 260, the first PD 261, and the second PD 262, and the waveguides 259 that comprises the primary waveguide 250, and the first and second waveguides 251 and 252, each divided from the primary waveguide 250. The primary waveguide 250 includes the front waveguide 250b arranged in upstream of the base PD 260 and the rear waveguide 250a disposed in downstream of the base PD 260.

The front waveguide 250b optically couples with the active waveguide 311 of the tunable LD 3 as illustrated in FIG. 7. The base PD 260, which is put between the front waveguide 250b and the rear waveguide 250a, may receive raw light of the tunable LD 3, where the raw light means that the light directly comes from the tunable LD 3 without passing any optical filters.

The rear waveguide 250a couples with the coupler 269 with the arrangement of 1×2 multi-mode coupler that divides light passing through the base PD 260 into two beams, one of which enters the first waveguide 251, while, the other of which enters the second waveguide 252.

One feature of the wavelength monitor 5C according to the present embodiment is that the first waveguide 251 has an arrangement of the Mach-Zender filter 251F. Specifically, the first waveguide 251 is divided into two waveguides, 251R1 and 251R2, then these two waveguides, 251R1 and 251R2, merge again to constitute the Mach-Zender filter 251F. But the optical path length of two waveguides from the branch to the merger is different from the other.

The transmission spectrum of the Mach-Zender filter 251F shows the periodic behavior with respect to the wavelength of the light passing therethrough. A difference of the physical dimensions of two waveguides from the branch to the merger and the refractive index of material constituting two branches may influence the period of the periodic transmission spectrum.

The second Mach-Zender filter 252F has the mechanism same with those of the first Mach-Zender filter 251F above described. However, the difference of the optical path length between two waveguides from the branch to the merger is different from the other Mach-Zender filter.

Specifically, the period of the transmission spectrum of the first Mach-Zender filter 251F is different from the period of the transmission spectrum of the second Mach-Zender filter 252F.

As illustrated in FIG. 8, the first Mach-Zender filter 251F is put between the base PD 260 and the first PD 261; that is, the light output from the base PD 260 and transmitted through the first Mach-Zender filter 251F enters the first PD 261. While, the second Mach-Zender filter 252F is put between the base PD 260 and the second PD 262. The light coming from the base PD 260 and passing through the second Mach-Zender filter 252F enters the second PD 262.

The transmission spectra of the Mach-Zender filters, 251F and 252F, and an algorithm to decide the current emission wavelength of the tunable LD 3 will be described in detail.

Figure 9A:
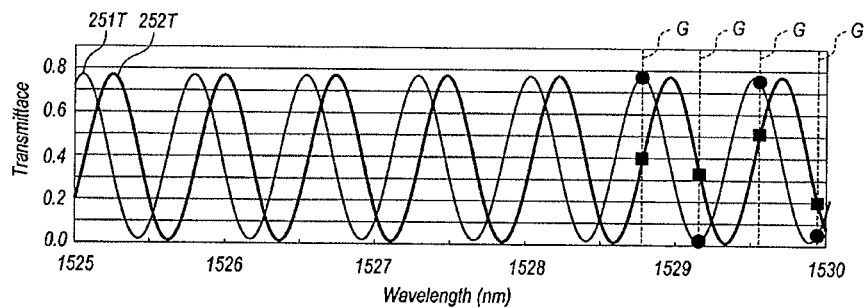
FIGS. 9A to 9C show transmission spectra of the Mach-Zender filters implemented within the wavelength monitor shown in FIG. 8.
Figure 9B:
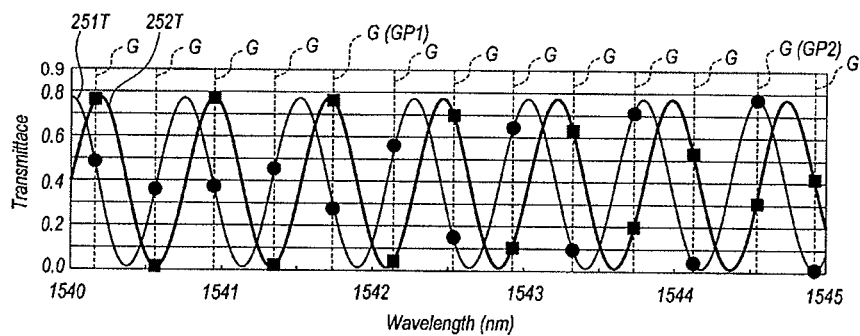
Figure 9C:
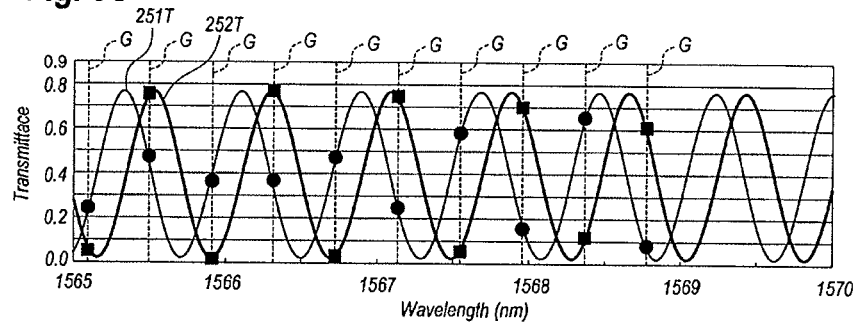

FIGS. 9A to 9C show transmission spectra of respective Mach-Zender filters, 251F and 252F, in a wavelength range from 1525 to 1570 nm which is attributed to the WDM system. FIGS. 9A to 9C also denote the grid wavelengths G defined in the WDM system, where a span between the nearest grids is set to be 50 GHz, or about 0.4 nm.

The transmission spectra, 251T and 252T, of the Mach-Zender filters, 251F and 252F, are different from those of the ring filters, 51F and 52F, shown in FIGS. 5A to 5C, that is, although the transmission spectra, 251T and 252T, show a periodic behavior but the shape thereof is sinusoidal compared with those of the ring filter, 51F and 52F. Similar to two ring filters, 51F and 52F, the period of the transmission spectra, 251F and 252F, are different from the other.

The period of the first Mach-Zender filter 51F is preferably different from the span of the grid wavelengths. Moreover, the period of the second Mach-Zender filter 52F is preferably different from the span of the grid wavelengths and also from the period of the first Mach-Zender filter 51F. In FIGS. 9A to 9C, filled circles each corresponds to the transmittance of the first Mach-Zender filter 251F at respective grid wavelengths, while, filled squares each corresponds to the transmittance of the second Mach-Zender filter at respective grid wavelengths.

The peak wavelengths of the transmission spectrum of the first Mach-Zender filter, and those of the second Mach-Zender filter depend of the refractive index of materials of two waveguides, 251R1 and 251R2, and the difference of the optical path length between two waveguides, 251R1 and 251R2. The same situation may be applicable to the second Mach-Zender filter 252F.

The MCU 121 first selects one of two Mach-Zender filters, 251F and 252F, based on a condition that which slopes in the transmission spectrum becomes abrupt at the target wavelength. Then, the MCU 121 receives the output from the PD that couples with the selected Mach-Zender filter, 251F or 252F.

In an example, assuming the target wavelength is given by GP1 in FIG. 9B, the transmission spectrum 251T of the first Mach-Zender filter 251F shows a greater slope, or greater rate of change than the transmission spectrum 252T for the second Mach-Zender filter 252F. Then, the MCU 121 selects the first Mach-Zender filter 251F and the first PD 261 for the wavelength tuning.

In another example, when the target wavelength is given by GP2, the rate of change in the first transmission spectrum 251T for the first Mach-Zender filter 251F becomes substantially zero, while, that of the second Mach-Zender filter 252F becomes substantially maximum. Then the MCU 121 may select the second Mach-Zender filter 252F and second PD 62 for tuning the emission wavelength of the tunable LD 3.

Then, the MCU 121 may adjust the temperature of the tunable LD 3 such that the output of the first PD 261 with respect to the output of the base PD 260 becomes substantially equal to the transmittance of the first Mach-Zender filter 251F, where it seems to be about 0.266 in the present case.

Similarly, when the emission wavelength of the LD 3 is selected to be the other grid wavelength GP2 in FIG. 9B, the MCU 121 may control the temperature of the tunable LD 3 such that the transmittance of the second Mach-Zender filter 252F, which may be obtained from the output of the second PD 262 with respect to the output of the base PD 260, becomes close to a value of 0.305.

After roughly setting the emission wavelength of the tunable LD 3, the bias $V_7$ applied to the SOA 7 is set so as to increase the optical absorption by the SOA 7 not to output the light from the output port 1P. Moreover, when the optical modulator 9 controls the output thereof, the MCU 121 sets the bias $V_7$ to make the SOA 7 active and the bias $V_9$ to the modulator 9 to modulate light from the SOA 7. Thus, the wavelength lockable LD 1C may output the modulated light from the output port 1P.

The wavelength lockable LD 1C may monitor the wavelength of the light generated in the tunable LD 3 by the base PD 260, the first and second PDs, 261 and 262. The first PD 261 may monitor the light passing through the first Mach-Zender filter 251F, while, the second PD 262 may monitor the light passing through the second Mach-Zender filter 252F. The transmission spectra of two Mach-Zender filters, 251F and 252F, are different from each other; accordingly, the wavelength monitor 5C may monitor the wavelength in a wide range. Still further, the transmission spectra of two Mach-Zender filters, 251F and 252F, may be set in a combination which is specific to the grid wavelengths within the wavelength range. Therefore, even the Mach-Zender filter shows a periodic transmission spectrum, which means that a plurality of equivalent wavelengths gives the substantially same transmittance, only one wavelength specific to the combination of two transmittance may be selected.

Thus, the wavelength lockable LD 1C may tune the emission wavelength thereof precisely in the preset grid wavelength by the algorithm below.

That is, one of two Mach-Zender filters, 251F and 252F, is first selected under a condition that the slope of the transmittance thereof against the wavelength is larger in the requested grid wavelength, such as GP1 and GP2, which means that one of the PDs, 261 and 262, is selected to monitor the wavelength. Next, the emission wavelength of the tunable LD 3 is controlled such that the transmittance of the selected Mach-Zender filter, 251F or 252F, calculated by the output of the selected PD, 261 or 262, and the base PD 260 becomes equal to the designed transmittance of the selected Mach-Zender filter, 251F or 252F, by controlling the temperature of the tunable LD 3. In this process, because the selected Mach-Zender filter, 251F or 252F, shows a greater rate of the change in the transmittance compared with that of the unselected Mach-Zender filter, 251F or 252F, the precise monitoring of the emission wavelength may be performed, which means that the precise tuning of the emission wavelength may be realized.

The wavelength lockable LD 1C of the present embodiment couples the optical output port 1P with the end of the active waveguide 311 opposite to the end with which the wavelength monitor 5C couples.

This arrangement enables to tune the emission wavelength of the tunable LD 3 in the desired grid wavelength under a condition where the output port 1P emits no light.

Moreover, the wavelength monitor 5C of the present embodiment may have two Mach-Zender filter, 251F and 252F, showing respective transmittances in a combination thereof specific to the grid wavelength in the preset wavelength range. Accordingly, even the Mach-Zender filter shows the periodic transmission spectrum, which inevitably has a plurality of equivalent wavelengths each showing the same transmittance, the wavelength monitor 5C of the present embodiment may determine the specific wavelength in the wavelength range. Thus, even the tunable LD 3 shifts the emission wavelength more than one period of the periodic transmission spectrum of the Mach-Zender filter, 251F or 252F, the wavelength monitor 5C may securely detect the shift and the wavelength lockable LD 1C may recover the target emission wavelength.

(Fourth Embodiment)

Figure 10:
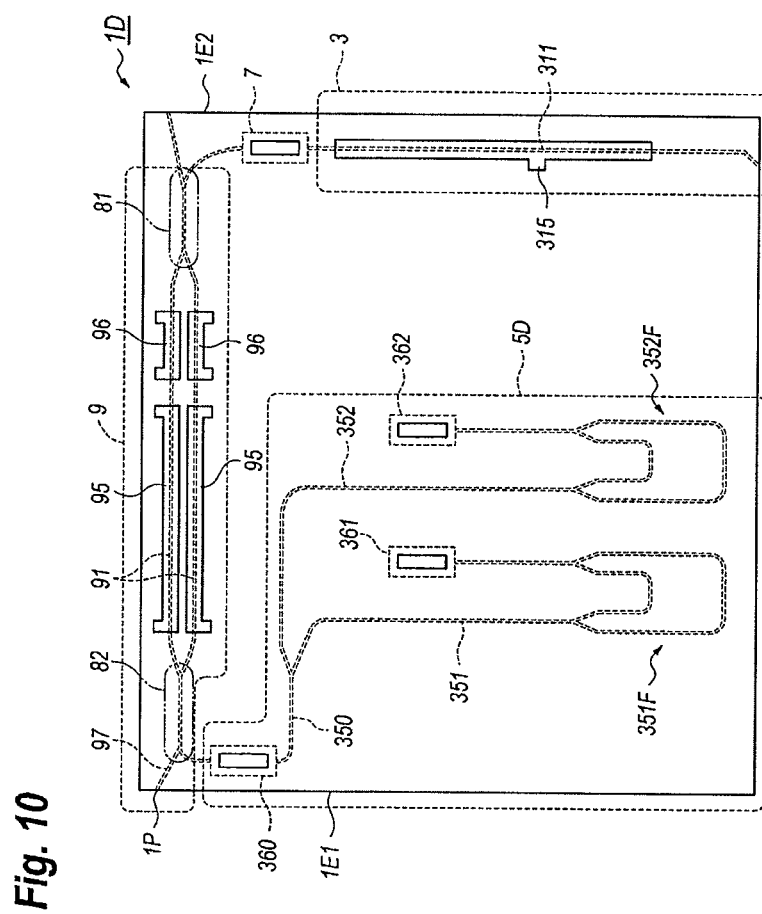
FIG. 10 is a plan view showing still another wavelength lockable LD according to the fourth embodiment of the invention.

Next, another wavelength lockable LD 1D according to the fourth embodiment of the present invention will be described. FIG. 10 is a plan view of the wavelength lockable LD 1D of the present embodiment, where the wavelength lockable LD 1D has substantially same arrangement with those of the previous device 1C shown in FIG. 7 except for the arrangement of the wavelength monitor 5D.

The wavelength monitor 5D of the present embodiment optically couples with the tunable LD 3 in the front end of the active waveguide 311 not in the rear end thereof as those of the previous wavelength monitor 5C. Specifically, the waveguide 350 of the wavelength monitor 5D optically couples with the active waveguide 311 through the MMI coupler 82, the waveguide 91, another MMI coupler 81, where they are in the optical modulator 9, and SOA 7. The rear end of the active waveguide 311 terminates at the facet perpendicular to the facet, 1E1 or 1E2.

The wavelength monitor 5D of the present embodiment has the waveguides, 351 and 352, extending along the direction of the active waveguide 311, which is perpendicular to the direction along which the waveguide of the optical modulator 9 extends. Two waveguides, 351 and 352, optically couple with respective Mach-Zender filters, 351F and 352F, and the PDs, 361 and 362.

The wavelength lockable LD 1D, similar to the previous LD 1C, may keep the emission wavelength thereof in the target gird wavelength by the mechanism same as those of the previous LD 1C, even when the LD 1D shifts the emission wavelength thereof broadly by some reasons. Moreover, because the active waveguide 311 and the waveguides, 351 and 352, in the wavelength monitor 5D extend along the direction perpendicular to the direction along which the waveguide 91 of the optical modulator extends, the total length of the wavelength lockable LD 1D may be decreased, which may facilitate the assembly of the LD 1D compared with those of the previous embodiment, where the plane size thereof is an extended rectangle.

The wavelength monitor of the present invention may have various alternatives. For instance, although the wavelength monitors, 5A to 5D, has two waveguides, 50a and 50b, putting the base PD 60 therebetween, the wavelength monitor 5A may have another arrangement where the waveguide 50 is divided into two waveguides, one of which couples with the base PD 60, while, the other of which is further divided into two waveguides each coupled with the first and second PDs, 61 and 62.

The wavelength monitor 5C in the third embodiment couples with the rear end of the active waveguide, that is, optically couples with the end opposite to the one coupling with the SOA 7, the wavelength monitor 9, and the output port 1P. However, the wavelength monitor 5C may couple with the front end of the active waveguide 311 as those of the fourth embodiment 5D through the optical modulator 9 and the SOA 7. On the other hand, the wavelength monitor 5D of the force embodiment may optically couple with the rear end of the active waveguide 311.

(Fifth Embodiment)

Figure 11:
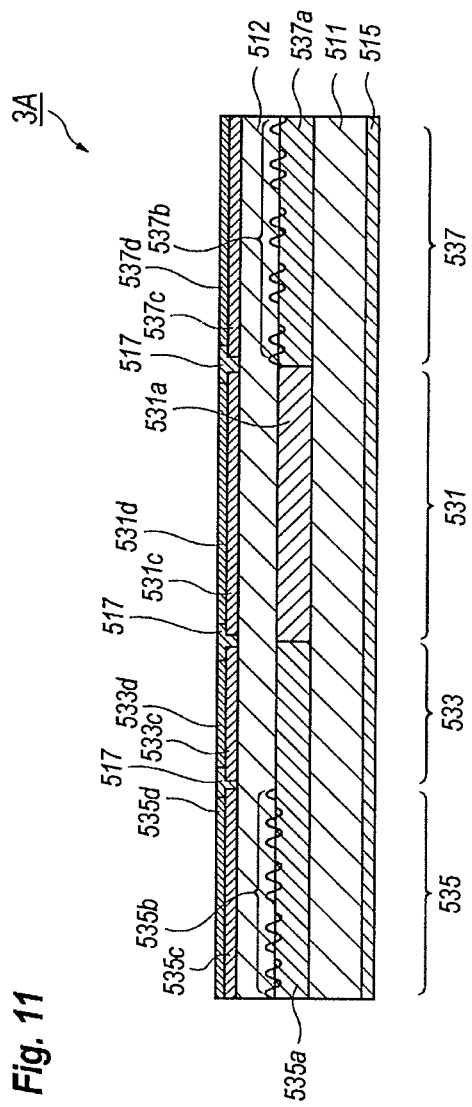
FIG. 11 shows a cross section of another tunable LD able to be integratable with the wavelength monitor of the present invention.
Figure 12:
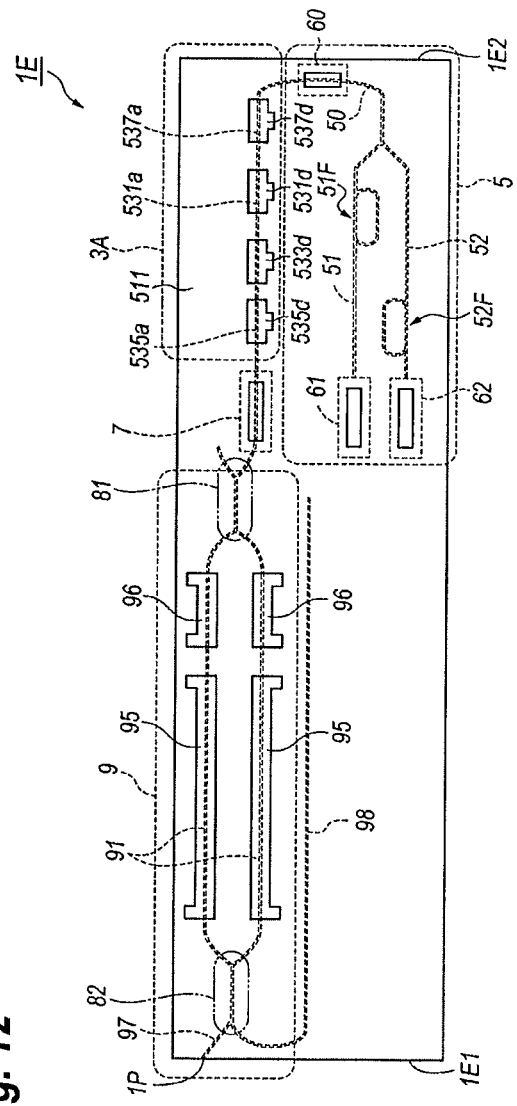
FIG. 12 is a plan view showing still another wavelength lockable LD according to the fifth embodiment of the invention, where the wavelength lockable LD integrates the tunable LD shown in FIG. 11.

Finally, a detail of the tunable LD 3 will be further described. FIG. 11 shows a cross section of the tunable LD 3A along the optical axis thereof according to the present invention, while, FIG. 12 is a plan view of a wavelength lockable LD 1E implemented with the tunable LD 3A.

The tunable LD 3A of the present embodiment includes the gain region 531, the phase adjusting region 533, the first and second sampled grating distributed Bragg reflector (hereafter denoted as SG-DBR) regions, 535 and 537. The gain region 531 has the same arrangement with those 311 in the former embodiments. These four regions, 531 to 537, are arranged on the common semiconductor substrate 511, and along the optical axis of the tunable LD 3A.

The gain region 531 has the active waveguide 531a, the upper cladding layer 512 above the active waveguide 531a, a contact layer 531c above the upper cladding layer 512, and the anode 531d above the contact layer 531d. The active waveguide 531a may be made of material with a longer bandgap wavelength, equivalently, a smaller bandgap energy, and extends along the optical axis with a length of, for instance, 500 μm. The active waveguide 311 may include a lower separate confinement hetero-structure layer (hereafter denoted as SCH layer), an upper SCH layer, and an active layer put between these two SCH layers. The SCH layers may be made of GaInAsP with a bandgap wavelength of 1.25 pm and a thickness of 50 nm.

The active layer in the active waveguide 531a may have the multiple quantum well (hereafter denoted as MQW) structure including a plurality of well layers made of GaInAsP with a thickness of 5 nm and a plurality of barrier layers made of also GaInAsP with a thickness of 10 nm but having a composition different from the composition of the well layer. The well layers and the barrier layers are alternately stacked to each other. The peak wavelength of the active layer measured by the photoluminescence spectrum is 1550 nm. The total thickness of the active waveguide 531a is, for example, about 0.2 µm.

The upper cladding layer 512 may be made of p-type semiconductor material, for instance p-type InP, with a thickness of about 1500 nm. The upper cladding layer 512 is common in all regions of the gain region 531, the phase adjusting region 533, the first SG-DBR region 535 and the second SG-DBR region 537.

The contact layer 531c may be made of p-type semiconductor material such as p-type InGaAs with a thickness of about 200 nm. The anode electrode 531d may be made of eutectic metal such as AuZn to make an ohmic contact to the contact layer 531c. The anode electrode 531d and the cathode electrode 515 in the back surface of the substrate 511 may inject carriers into the active waveguide 531a which may induce the recombination of electrons and holes in the active waveguide 531a and photons are generated therein. The photon may be converted into the laser light by propagating within the active waveguide 531a.

The phase adjusting region 533, which locates outside of the gain region 531, exactly between the gain region 531 and the first SG-DBR region 535. The phase adjusting region 533 includes a portion of the waveguide 535a, the contact layer 533c and the anode electrode 533d. The waveguide 535a may be made of material having a bandgap wavelength shorter than that of the active waveguide 531a, namely, the bandgap energy of the waveguide in the phase adjusting region 533 is wider than that of the active waveguide 531a, which means that the waveguide 535a is substantially transparent for the light generated in the gain region 531. The phase adjusting region has a length of about 200 µm along the optical axis, and may be made of un-doped InGaAsP with the photoluminescence peak at 1350 nm and a thickness of about 0.35 µm.

The contact layer 533c and the anode electrode 533d of the phase adjusting region 533 may be made of materials same with those of the gain region, 531c and 531d, and may have a thickness same with those of the gain region, respectively. The phase adjusting region 533 has a function to adjust phase of the light propagating in the waveguide thereof. Specifically, injecting carriers into the waveguide 535a from the anode 533d and the cathode electrode 515, the refractive index of the waveguide 535a may vary, which also varies the phase propagating therein. Thus, the side mode suppression ratio of the light emitted from the tunable LD 3 may be enhanced.

The first SG-DBR region 535 is in an outside of the phase adjusting region 533; while, the second SG-DBR region 537 is in an outside of the gain region 531. Two SG-DBR regions, 535 and 537, each has a length of bout 600 µm along the optical axis thereof.

The first SG-DBR region 535 includes a portion of the waveguide 535a, the upper cladding layer 512, the contact layer 535c and the anode electrode 535d, where each of layers is stacked on the substrate 511 in this order; while, the second SG-DBR region 537 includes the waveguide 537a, the upper cladding Lauer 512, the contact layer 537c, and the anode electrode 537d, where each of layers is also stacked on the substrate 511 in this order.

Portions of the upper cladding layer 512 not converted with the contact layer, 531c to 537c, and the anode electrodes, 531d to 537d, are covered with an insulating film made of, for instance, silicon die-oxide ($SiO_2$), which securely isolate respective contact layers, 531c to 537c, and respective anode electrodes, 531d to 537d.

The contact layers, 355c and 357c, and the anode electrodes, 355d and 357d, of the first and second SG-DBR regions, 355 and 357, respectively, may be made of material same with those of the gain region 531.

Furthermore, the first and second SG-DBR regions, 535 and 537, includes a sampled grating (SG) in an interface between the waveguide, 535a or 537a, and the upper cladding layer 512, which comprises of a plurality of grating regions and a plurality of space regions alternately arranged to the others along the optical axis. The SG shows a periodic reflectance spectrum.

Two SG-DBR regions, 535 and 537, may tune the emission wavelength of the tunable LD 3A. Specifically, because two SG-DBR regions, 535 and 537, forms the optical cavity for the photons generated in the gain region 531, and the periodic reflectance spectrum of the SG-DBR region, 535 and 537, depends on the injected carriers; the emission wavelength of the tunable LD 3A may be tuned by adjusting the bias conditions, namely, injected carriers of two SG-DBR regions, 535 and 537. Ordinarily, the period of the periodic reflectance spectrum of two SG-DBR regions, 535 and 537, are set to be slightly different from the others. The laser oscillation may occur at the wavelength where respective reflectance peaks of two SG-DBR regions, 535 and 537, coincide with others, or the emission wavelength may be tuned by adjusting the injected carriers so as to emission wavelength becomes equal to the target wavelength.

Figure 13:
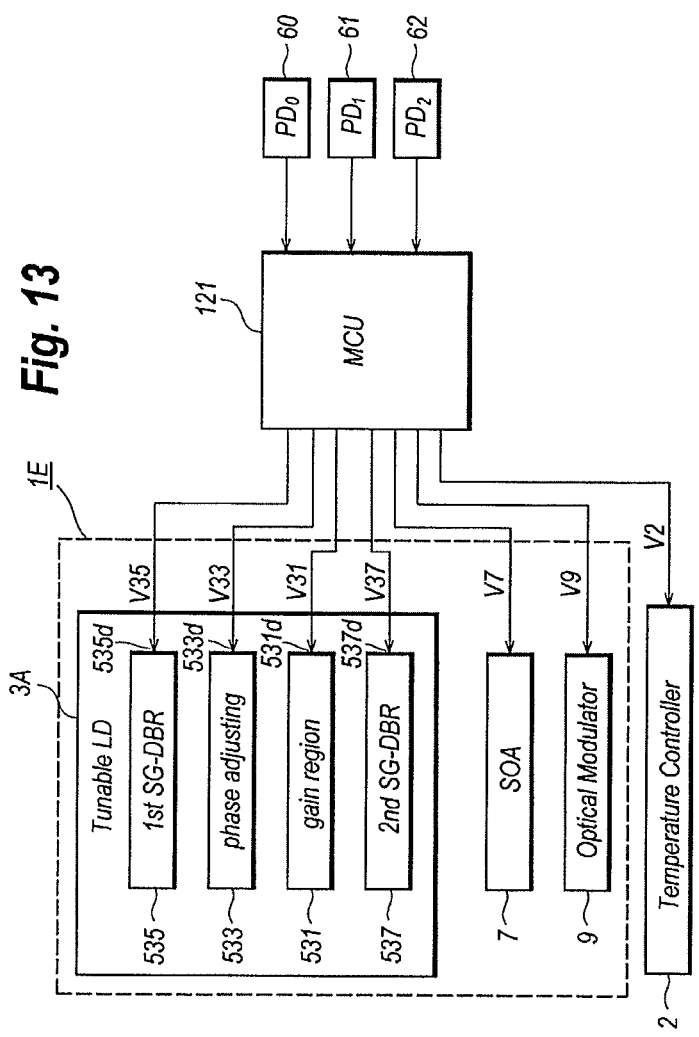
FIG. 13 shows a block diagram of the circuit to tune the emission wavelength of the wavelength lockable LD shown in FIG. 12.

FIG. 13 shows a block diagram to control the emission wavelength of the wavelength lockable LD 1E of the present embodiment, which is modified from those shown in FIG. 3. Although previous embodiments concentrate of the tunable LD whose emission wavelength may be tuned by varying the temperature thereof. While, the LD 3A of the present embodiment may tune the emission wavelength by adjusting the bias conditions; accordingly, the MCU first sets the temperature of the tunable LD 3A by setting the bias V2 to the TEC in a preset value and maintains the temperature during the operation.

The MCU 121 then sets the biases, V31 to V37, in preset conditions in order to set the emission wavelength roughly coincide with one of the grid wavelength, which is called as the target wavelength. The bias conditions, V31 to V37, are measured in advance to the practical operation of the wavelength lockable LD 1E and stored in a memory as a look-up-table. At this step, the emission wavelength becomes nearly coincident with the target wavelength but not exactly coincident therewith. The MCU then precisely tunes the emission wavelength by monitoring the output of the first $PD_1$ and comparing the transmittance of the first ring filter calculated from the monitored output of the first $PD_1$ with the designed transmittance. The MCU tunes the biases, V33 to V37, such that the transmittance of the ring filter 51F measured from the output of the first $PD_1$ becomes coincident with the designed value.

The MCU 121 then verifies the emission wavelength based on the output of the second $PD_2$, that is, when the transmittance of the second ring filter 52F also has the periodic spectrum, however, the period thereof is different from the others. Then, transmittances of the second ring filter at the grid wavelengths show a monotonic behavior; accordingly, the MCU 121 may verify whether the emission wavelength is in the target wavelength or not, even the transmittance of the first ring filter obtained from the output of the first $PD_1$ is in accordance with the designed transmittance.

When the emission wavelength is tuned in a wavelength different from the target wavelength, the MCU adjusts the biases, V33 to V37, so as to make the transmittance of the second ring filter 52F coincident with the designed transmittance. Thus, the emission wavelength of the tunable LD 3A may be precisely tuned in the target wavelength. After tuning the emission wavelength, the MCU 121 sets other biases, V7 and V9, in respective conditions. The bias V7 applied to the SOA 7 may adjust the magnitude of the output from the wavelength lockable LD 1E, while, the condition V9 to the optical modulator 9 may drive ideally.

(Sixth Embodiment)

Figure 14:
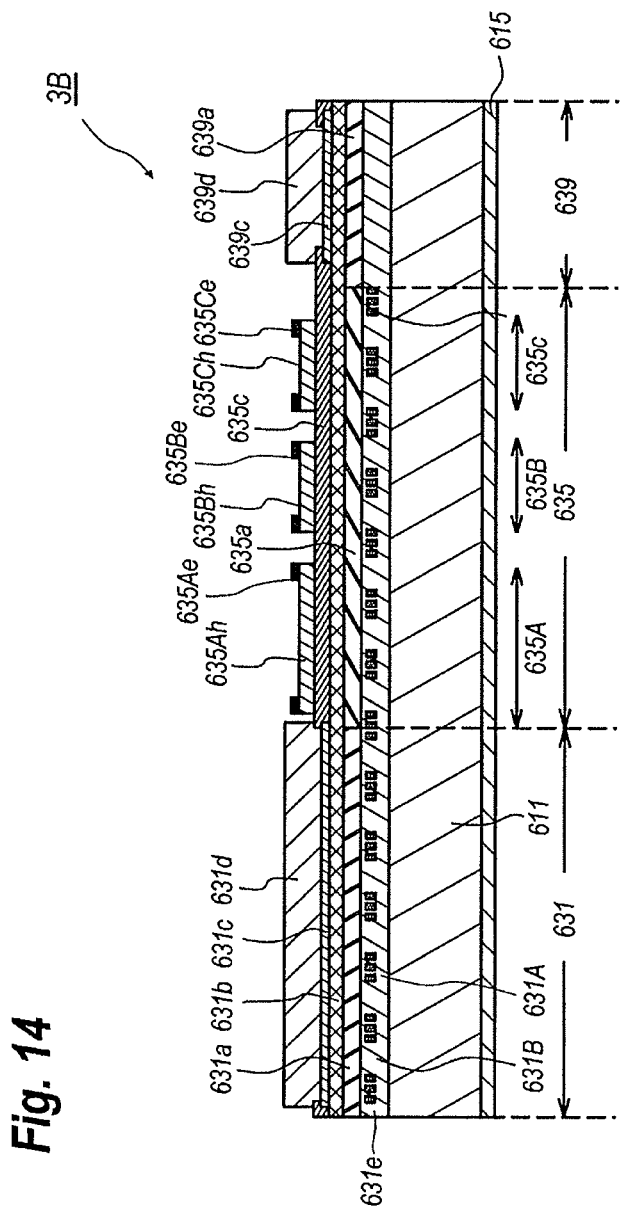
FIG. 14 shows a cross section of still another tunable LD integratable with the wavelength monitor according to the present invention.

The present invention does not restrict the tunable LD in an arrangement shown in FIG. 11. FIG. 14 is a cross section of still another tunable LD 3B, which includes a modified gain region 631 with a structure of the sampled grating distributed feedback (SG-DFB) structure, and a chirped SG-DBR regions 635. Specifically, The SG-DFB region 631 includes, on the semiconductor substrate 611, the lower cladding layer 631e, the active layer 631a, the upper cladding layer 631b, the contact layer 631c and the anode electrode 631d. The SG-DFB region 631 further includes a plurality of grating regions 631A and a plurality of space regions 631B alternately arranged to each other along the optical axis. One grating region 631A and one space region 631B continuous to the grating region 631A constitutes one segment; and the SG-DGB region includes a plurality of segments. The optical grating in the grating regions 631A may be made of material different from that of the lower cladding layer 631e and buried within the lower cladding layer 631e. When the lower cladding layer is made of InP, the grating optical grating may be made of, for instance, $Ga_{0.22}In_{0.78}As_{0.47}P_{0.53}$.

On the other hand, the CSG-DBR region 635 includes, on the semiconductor substrate 611, the lower cladding layer 631e, the waveguide layer 635a, the upper cladding layer 631b, the insulating film 635c, and a plurality of heaters, 635Ah to 635Ch. The waveguide layer 635a may be made of $Ga_{0.22}In_{0.78}As_{0.4}P_{0.53}$, which has a shorter bandgap wavelength compared with that of the active layer 631a in the gain region 631. That is, the waveguide layer 635a in the CSG-DBR region 635 is substantially transparent to the light generated in the gain region 631. Each of heaters, 635Ah to 635Ch, has electrodes, 635Ae to 635Ce. The lower cladding layer 631e and the upper cladding layer 631b of the gain region 631 extend in the CSG-DBR region 635, namely, these two layers, 631e and 631b, are common in the gain region 631 and the CSG-DBR region 635. The CSG-DBR region 635 includes three blocks, 635A to 635C. Each of blocks has a plurality of segments comprised of a grating region 631A and the space region 631B as those in the gain region 631. A feature of the CSG-DBR region 635 is that at least one block, 635A to 635C, has an optical length of the space region different from the optical length of the other blocks, and each of blocks, 635A to 635C, accompanies with a monolithic heater, 635Ah to 635Ch, in the top of the device.

While, as described above; each segment in the gain region 631 has the same optical length. Accordingly, the SG-DFB region 631 may have a plurality of gain peaks with a constant pitch, while, the CSG-DBR region 635 includes three units, 635A to 635c, at least one of the units has a specific optical length in the space region 631b, and the optical length may be varied by the temperature controllable by respective heaters, 635Ah to 635Ch. Therefore, the laser oscillation may occur in a strict condition where one of the discrete gain peaks in the SG-DFB region 631 coincides with one of the reflectance peaks in the CSG-DBR region. Moreover, because the reflectance peaks in the CSG-DBR region 635 may be controlled by adjusting the temperature of respective blocks, 635A to 635C, one of segments dominates the wavelength tuning, which may not only tune the emission wavelength precisely but widen the tuning range of the emission wavelength.

The tunable LD 3B of the present embodiment may further include an absorption region 639 in a side opposite to the gain region 631 with respect to the CSG-DBR region 635. That is, the absorption region 639 and the gain region 631 put the CSG-DBR region 635 therebetween. The absorption region 639 includes, on the substrate 611, the lower cladding layer 631e, the absorption layer 639a, the upper cladding layer 631c, the contact layer 639c and the electrode 639d. The absorption layer 639a may be made of material that can absorb the light emitted in the gain region 631. The absorption layer 639a preferably has a bandgap wavelength longer than the emission wavelength of the LD 3B. Further preferably, the bandgap wavelength of the absorption layer is longer than a longest wavelength at which the tunable LD 3B may oscillate. Specifically, the absorption layer 639a may have the MQW structure constituted by well layers made of $Ga_{0.47}In_{0.53}As$ with a thickness of 5 nm and barrier layers made of $Ga_{0.28}In_{0.72}As_{0.61}P_{0.39}$ with a thickness of 10 nm. The absorption layer 639a may be made of a bulk of $Ga_{0.46}In_{0.54}As_{0.98}P_{0.02}$. The embodiment shown in FIG. 3B has the absorption layer 639a made of the same material with those of the active layer 631a of the gain region 631. The absorption layer may have the function to absorb light generated in the gain region 631 but leaked through the CSG-DBR region 635. When the leaked light increases, the light reflected at the face of the absorption region 639 backs in the gain region 641, which becomes an optical noise and degrades the emission characteristic of the tunable LD 3B. Varying the bias condition applied to the electrode 639d, the absorption characteristic of the region 639 may be widely changed. When the tunable LD 3B integrates the absorption region 639, the wavelength monitor according to the present invention may optically couple with the front side of the gain region 631.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A wavelength monitor integrated with a tunable laser diode (LD) to form a wavelength lockable LD, comprising:
    a base photodiode (PD) configured to monitor light generated by the tunable LD;
    a first optical filter to transmit the light generated by the tunable transmitted through the base PD and a first waveguide, the first optical filter having a first transmittance spectrum periodically varying in a wavelength range of a wavelength division multiplexing (WDM) system;
    a first PD configured to monitor first light generated by the tunable LD, transmitted through the base PD, the first waveguide, and the first filter, the first transmittance depending on the base PD and the first PD;
    a second optical filter to transmit the light generated by the tunable LD, transmitted through the base PD and a second waveguide, the second optical filter having a second transmittance spectrum periodically varying in the wavelength range of the WDM system; and a second PD configured to monitor second light generated by the tunable LD, transmitted through the base PD, the second waveguide, and the second filter, the second transmittance depending on the PD and the second PD, wherein the first transmittance spectrum and the second transmittance spectrum at a grid wavelength of the WDM system have a combination in respective transmittances specific to the grid wavelength different from combinations of respective transmittances at other grid wavelengths of the WDM system, wherein the first filter and the second filter are disposed in parallel with respect to the base PD, and wherein the wavelength monitor selects one of the first filter and the second filter based upon which of the first filter and the second filter has a larger slope or a greater rate of change in transimittance spectra at grid wavelength within the grid wavelength spectrum of the WDM system.

2. The wavelength monitor of claim 1,
wherein at least one of the first optical filter and the second optical filter has an arrangement of a Mach-Zender filter.

3. A wavelength monitor integratable with a tunable laser diode (LD) to form a wavelength lockable LD for a wavelength division multiplexing (WDM) system, the wavelength monitor comprising:

a base photodiode (PD) configured to monitor light generated by the tunable LD;

a first waveguide;

a first optical filter to transmit the light generated by the tunable LD and transmitted through the base PD and the first waveguide, the first optical filter having a first transmittance spectrum periodically varying in a wavelength range of the WDM system;

a first PD configured to monitor first light generated by the tunable LD and transmitted through the base PD, the first waveguide, and the first filter, the first transmittance depending on the base PD and the first PD;

a second waveguide;

a second optical filter to transmit the light generated by the tunable LD and transmitted through the base PD and the second waveguide, the second optical filter having a second transmittance spectrum periodically varying in the wavelength range of the WDM system; and a second PD configured to monitor second light generated by the tunable LD and transmitted through the base PD, the second waveguide, and the second filter, the second transmittance depending on the base PD and the second PD, wherein the first filter and the second filter are disposed in parallel with respect to the base PD, wherein the first transmittance spectrum and the second transmittance spectrum at a specific grid wavelength of the WDM system have respective transmittances that are different from their respective transmittances at other grid wavelengths of the WDM system, and wherein the wavelength monitor selects one of the first filter and the second filter based upon Which of the first filter and the second filter has a larger slope or a greater rate of change in transmittance spectra at a grid wavelength within the grid wavelength spectrum of the WDM system.

4. The wavelength monitor of claim 3,
wherein at least one of the first optical filter and the second optical filter has an arrangement of a Mach-Zender filter.

* * * * *